(12) United States Patent
Ohyama et al.

(10) Patent No.: US 8,212,705 B2
(45) Date of Patent: Jul. 3, 2012

(54) PIPELINE ADC

(75) Inventors: Soichiro Ohyama, Atsugi (JP); Katsuhiko Ariyoshi, Yokohama (JP)

(73) Assignee: Texas Instruments Incorporated, Dallas, TX (US)

( * ) Notice: Subject to any disclaimer, the term of this patent is extended or adjusted under 35 U.S.C. 154(b) by 116 days.

(21) Appl. No.: 12/790,535

(22) Filed: May 28, 2010

(65) Prior Publication Data

US 2010/0309034 A1 Dec. 9, 2010

(30) Foreign Application Priority Data

Jun. 1, 2009 (JP) .................................. 2009-132360

(51) Int. Cl.
*H03M 1/38* (2006.01)

(52) U.S. Cl. ....................................... 341/161; 341/155

(58) Field of Classification Search .................. 341/161, 341/162, 163, 118, 155, 156, 119, 120, 172
See application file for complete search history.

(56) References Cited

U.S. PATENT DOCUMENTS 6,900,749 B2 * 5/2005 Tani et al. ..................... 341/118

FOREIGN PATENT DOCUMENTS

JP 10-163875 6/1998

* cited by examiner

*Primary Examiner* — Joseph Lauture
(74) *Attorney, Agent, or Firm* — John J. Patti; Wade J. Brady III; Frederick J. Telecky, Jr.

(57) ABSTRACT

Pipeline analog-to-digital converters (ADCs) are used in many applications, but because of the configuration, components may be idled, which wastes power. Here, an ADC is provided that enables one or more stages to be switched off during a power conservation mode. By using switch networks, the ADC can produce accurate results with reduced power consumption, as desired.

20 Claims, 4 Drawing Sheets

PIPELINE ADC

CROSS-REFERENCE TO RELATED APPLICATIONS

This application is claims priority from Japanese Patent Application No. 2009-132360, filed Jun. 1, 2009, which is hereby incorporated by reference for all purposes.

TECHNICAL FIELD

The invention generally relates to a pipeline analog-to-digital converter (ADC).

BACKGROUND

Pipeline ADCs are employed is in wide variety of applications, such as for signal processing in the field of video and communication. An example of a conventional circuit is Japanese Patent Application No. JP10-163,875. In many of these applications, in order to decrease power consumption by the signal processor, the frequency of the clock signal is switched. For example, when pictures are taken and recorded to a memory in a digital camera, in order to increase the resolution of the pictures, the frequency of the clock signal is increased, and the clock signal is decreased to lower the resolution of the image only in the period when the image of the object is displayed on the screen. That way, switching the frequency of the clock signal to correspond to the user's application mode or the like, it is possible to efficiently decrease the current consumption, particularly of the logic circuit. However, a pipeline ADC is a circuit with combined analog and digital portions, and the current steadily consumed by the analog portion is larger than that consumed in the digital portion. The method for switching the frequency of the clock signal is effective in decreasing the current flowing any time the logic value of the output of the digital portion varies. However, this method has no effect at all in decreasing the current steadily consumed in the analog portion.

SUMMARY

In accordance with a preferred embodiment of the invention, an apparatus is provided. The apparatus comprises a clock generator that generates a plurality of clock signals; a sample-and-hold (S/H) circuit that is coupled to the clock generator and that receives an input signal; a plurality conversion stages coupled in series with one another in a sequence, wherein each conversion stage is coupled to the clock generator; a switch network that is coupled to at least one of the conversion stage so as to turn it off and bypass it in a power conservation mode; a plurality of delay circuits, wherein each delay circuit is coupled to at least one of the conversion stages, and wherein each delay circuit includes at least one latch that is coupled to the clock generator; a plurality of correction circuit, wherein each correction circuit is coupled to at least one of the delay circuits; and a register that is coupled to each of the correction circuits.

In accordance with a preferred embodiment of the invention, the apparatus further comprises a clock switch that is coupled between the clock generator and each of the delay circuits.

In accordance with a preferred embodiment of the invention, the clock switch that is coupled between the clock generator and each of the conversion stages.

In accordance with a preferred embodiment of the invention, wherein the switch network further comprises: a first switch that is coupled between the S/H circuit and the first conversion stage of the sequence, wherein the first switch is closed in a normal mode, and wherein the first switch is open in the power conservation mode; a second switch that is coupled between the S/H circuit and the second conversion stage of the sequence, wherein the second switch is open in the normal mode, and wherein the second switch is closed in the power conservation mode; a third switch that is coupled between a power supply and the first conversion stage of the sequence, wherein the third switch is closed in the normal mode, and wherein the third switch is open in the power conservation mode; and a fourth switch that is coupled between the first conversion stage of the sequence and its delay circuit, wherein fourth switch couples the first conversion stage of the sequence to it delay circuit in the normal mode.

In accordance with a preferred embodiment of the invention, the apparatus further comprises a crossbar that is coupled between at least one of the conversion stages and its delay circuit.

In accordance with a preferred embodiment of the invention, the switch network further comprises: a first switch that is coupled between the third-to-last conversion stage of the sequence and the second-to-last conversion stage of the sequence, wherein the first switch is closed in a normal mode, and wherein the first switch is open in the power conservation mode; a second switch that is coupled between the third-to-last conversion stage of the sequence and the last conversion stage of the sequence, wherein the second switch is open in the normal mode, and wherein the second switch is closed in the power conservation mode; a third switch that is coupled between a power supply and the second-to-last conversion stage of the sequence, wherein the third switch is closed in the normal mode, and wherein the third switch is open in the power conservation mode; and a fourth switch that is coupled between the second-to-last conversion stage of the sequence and the clock generator, wherein fourth switch couples the first conversion stage of the sequence to it delay circuit in the normal mode.

In accordance with a preferred embodiment of the invention, the switch network further comprises a first switch network, and wherein the apparatus further comprises a second switch network that is coupled between the clock switch and the delay circuit associated with the first conversion stage of the sequence.

In accordance with a preferred embodiment of the invention, the switch network further comprises: a first switch that is coupled between the third-to-last conversion stage of the sequence and the second-to-last conversion stage of the sequence, wherein the first switch is closed in a normal mode, and wherein the first switch is open in the power conservation mode; a second switch that is coupled between the third-to-last conversion stage of the sequence and the last conversion stage of the sequence, wherein the second switch is open in the normal mode, and wherein the second switch is closed in the power conservation mode; a third switch that is coupled between a power supply and the second-to-last conversion stage of the sequence, wherein the third switch is closed in the normal mode, and wherein the third switch is open in the power conservation mode; and a fourth switch that is coupled between the second-to-last conversion stage of the sequence and the clock generator, wherein fourth switch couples the first conversion stage of the sequence to it delay circuit in the normal mode.

In accordance with a preferred embodiment of the invention, the switch network further comprises a first switch network, and wherein the apparatus further comprises a second switch network that is coupled between the clock generator and the delay circuit associated with the second-to-last conversion stage of the sequence.

In accordance with a preferred embodiment of the invention, the apparatus further comprises a crossbar that is couple between each of the correction circuits and the register.

In accordance with a preferred embodiment of the invention, an apparatus is provided. The apparatus comprises a clock generator that generates a plurality of clock signals; a sample-and-hold (S/H) circuit that is coupled to the clock generator and that receives an input signal; a plurality conversion stages coupled in series with one another in a sequence, wherein each conversion stage is coupled to the clock generator, and wherein each conversion stage includes: an analog-to-digital converter (ADC); a digital-to-analog converter (DAC) that is coupled to the DAC; a S/H circuit; an adder that is coupled to the S/H circuit and the DAC so as to generate a difference between output of the S/H circuit and the DAC; and an amplifier that is coupled to the adder; a switch network that is coupled to at least one of the conversion stage so as to turn it off and bypass it in a power conservation mode; a plurality of delay circuits, wherein each delay circuit is coupled to at least one of the conversion stages, and wherein each delay circuit includes at least one latch that is coupled to the clock generator; a plurality of correction circuit, wherein each correction circuit is coupled to at least one of the delay circuits; and a register that is coupled to each of the correction circuits.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
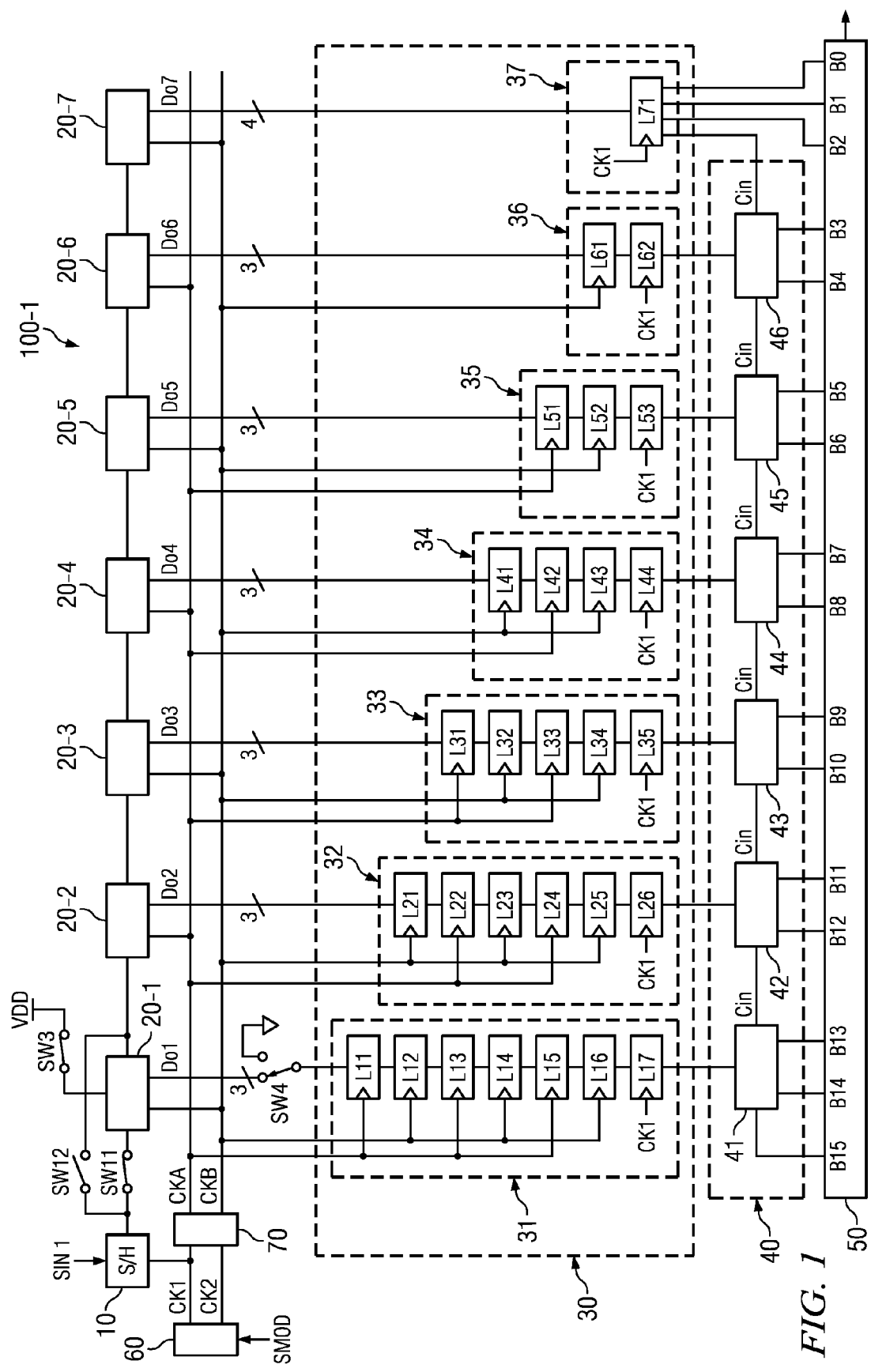
FIG. 1 is a block diagram of an example of an ADC in accordance with a preferred embodiment of the present invention.

Refer now to the drawings wherein depicted elements are, for the sake of clarity, not necessarily shown to scale and wherein like or similar elements are designated by the same reference numeral through the several views.

Turning to FIG. 1, an ADC 100-1 in accordance with a preferred embodiment of the present invention can be seen. ADC 100-1 generally comprises a sample-and-hold (S/H) circuit 10, conversion stages 20-1 to 20-7, delay circuit 30 (which includes delay circuits 31-37), correction circuit 40 (which includes correction circuits 41-46), register 50, clock generator 60, clock switch 70, and switches SW11, SW12, SW3, SW4. In operation, clock generator 60 generates two clock signals CK1, CK2 in different phases and changes their frequencies in response to control signal SMOD that indicates the operation mode. S/H circuit 10 carries out sampling and holding of the input analog signal SIN in synchronization with clock signal CK1.

Conversion stages 20-1 to 20-7 sequentially convert analog signal SIN held in S/H circuit 10 to digital signals Do1-Do7 from the most-significant bit to the least-significant bit. Conversion stage 20-1 converts analog signal SIN held in S/H circuit 10 to 3-bit digital signal Do1, and the difference between the analog signal corresponding to the digital signal Do1 and the input analog signal SIN is amplified and is output to the next stage (conversion stage (20-2)). Just as conversion stage 20-1, conversion stages 20-2 to 20-6 each convert its input signal from the preceding stage to a 3-bit digital signal Do2-Do6, amplify the difference between the analog signal, and output the amplified difference. Additionally, as an example, conversion stage 20-7 can be a flash type ADC, and the input signal from the preceding section (conversion stage 20-6) is converted to 4-bit digital signal Do7.

Figure 2:
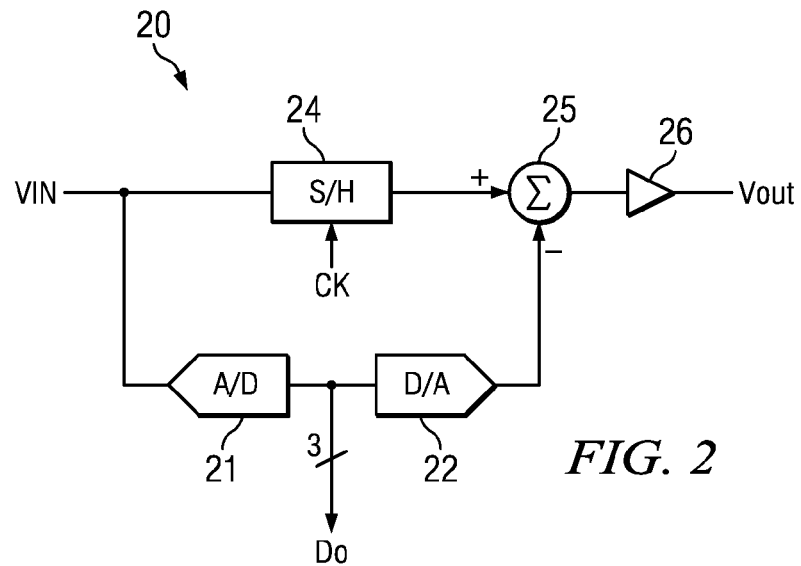
FIG. 2 is a block diagram of an example of a conversion stage of FIG. 1.

Turning now to FIG. 2 is a diagram illustrating an example of conversion stages 20-1 to 20-6 of FIG. 1 (hereinafter referred to as 20) can be seen. Conversion stage 20 generally comprises an ADC 21, a digital-to-analog converter (DAC) 22, an S/H circuit 24, an adder 25, and an amplifier. In operation the ADC generate digital signal Do from signal Vin, while DAC 22 converts signal Do back to an analog signal that is provided to the adder 25. S/H circuit 24 samples signal VIN based on clock signal, which is provided to the adder 25. Adder 25 determines the difference between the sample of signal VIN and the analog signal from DAC 22, and amplifier 26 amplifies the difference.

Figure 3:
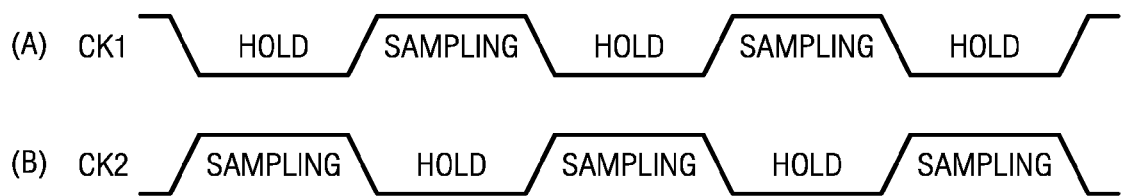
FIG. 3 is a timing diagram for the clock signals of FIG. 1.

In FIG. 3, a timing diagram for clock signals CK1 and CK2 can be seen. As shown, clock signals CK1 and CK2 are phase shifted from each other by 180°. This phase shift enables S/H circuit 10 (of FIG. 1) to sample and hold input signal SIN based on clock signal CK1.

Now, turning back to FIG. 1, the switch network of ADC 100-1 can control the conversion stage pipeline so as to operate in one of two modes: power conservation mode and normal mode. In power conservation mode, switches SW3 and SW11 are open, while switches SW12 is close, and while switch SW4 coupled the delay circuit 31 to ground. Thus, in power conservation mode, the power to stage 20-1 and delay circuit is cut off, and stage 20-1 is skipped or bypassed. In normal mode, switches SW3 and SW11 are closed, while switch SW12 is open and while switch SW4 couples stage 20-1 to delay circuit 31. Thus, the full pipeline can be used in the normal mode.

Looking to circuit 30, it includes delay circuits 31-37 that delay digital signals Do1-Do7 generated in conversion stages 20-1 to 20-7, respectively. Delay circuit 31-37 respectively comprise a 7-stage latch circuit (L11 to L17), a 6-stage latch circuits (L21 to L26), a 5-stage latch circuits (L31 to L35), a 4-stage latch circuits (L41 to L44), a 3-stage latch circuits (L51 to L53), a 2-stage latch circuits (L61 to L62), and a of 1-stage latch circuit (L71). Different clock signals (clock signal CKA or CKB which are output from clock switch 70) are input to the odd-numbered stages and even-numbered stages connected in tandem in delay circuits 31-36. That is, one clock signal is commonly input to the odd-numbered stages, while the other clock signal is commonly input to the even-numbered stages. Each latch circuit holds the input signal in synchronization with the rising edge of the clock signal. Typically, clock signal CK1 is fed to the last-stage latch circuits (L17, L26, L35, L44, L53, L62, L71) of delay circuits 31-37. However, just as with other latch circuits in the delay circuit, one may also adopt a method in which carry signal CKA or CKB is selectively fed corresponding to the operation mode.

Because clock signal CKA and clock signal CKB have phases shifted from each other by half-period (see, e.g., FIG. 3), the tandem latch circuit shifts the digital signal every half-period of the clock signal. That is, a delay of a half-period is generated due to one stage of the latch circuit. The delay of a half-period corresponds to the delay of one stage when digital signals Do1-Do7 are sequentially generated in conversion stages 20-1 to 20-7. The first-stage latch circuits (L11, L21, L31, L41, L51, L61, L71) of delay circuits 31-37 latch the digital signal when the state is changed from hold state to sampling state for the conversion stage preceding the conversion stage of the output origin of the latched digital signals Do1-Do7 that should be latched (or held by S/H circuit 10). For example, latch circuit L31 for input of digital signal Do3 of the 3rd conversion stage 20-3 latches digital signal Do3 when conversion stage 20-2 as the stage, preceding the conversion stage 20-3, transitions from hold state to sampling state. In normal mode, clock signal CK1 (or CKA) is input to conversion stage 20-2, and latch circuit L31 latches digital signal Do3 in synchronization with the rising edge of clock signal CK1 (or CKA).

Additionally, depending on to mode of operation, clock switch 70 can switch clock signals CK1 and CK2 fed to conversion stage 20 and delay circuit 30. That is, in normal mode, clock switch 70 outputs clock signal CK1 as clock signal CKA, and outputs clock signal CK2 as clock signal CKB. On the other hand, in power conservation mode, clock switch 70 outputs clock signal CK1 as clock signal CKB, and clock signal CK2 as clock signal CKA. More specifically, in normal mode, clock signal CK2 is input to the latch circuits of the odd-numbered stages of delay circuits 32, 34, and 36 and the latch circuits of the even-numbered stages of delay circuits 31, 33, and 35, and clock signal CK1 is input to the latch circuits of the even-numbered stages of delay circuits 32 and 34 and the latch circuits of the odd-numbered stages of delay circuits 31, 33, and 35. In power conservation mode, clock signal CK1 is input to the latch circuits of the odd-numbered stages of delay circuits 32, 34, and 36 and the latch circuits of the even-numbered stages of delay circuits 31, 33, and 35, and clock signal CK2 is input to the latch circuits of the even-numbered stages of delay circuits 32 and 34 and the latch circuits of odd-numbered stages of delay circuits 31, 33, and 35. In this power conservation mode, just as in normal mode, clock signal CK1 is fed to the last-stage latch circuits (i.e., L17, L26, L35, L44, L53, L62, L71) of various delay circuits 31-37.

As clock switch 70 switches clock signals CK1 and CK2 in power conservation mode, the timing of sampling of the input signal in conversion stages 20-2 to 20-6 downstream of the conversion stage 20-1 in the off state and timing in holding and sampling are inverted. Also, corresponding to inversion of timing in conversion stages 20-2 to 20-6, the timing of signal holding is also changed in delay circuits 32-36 that hold digital signals Do2-Do6 of conversion stages 20-2 to 20-6 downstream of conversion stage 20-1 in the off state. Additionally, because the number of the bypassed conversion stages is an odd number, clock switch 70 switches clock signal CK1 and clock signal CK2. On the other hand, when the number of the bypassed conversion stages is an even number, there is no need to switch between clock signal CK1 and clock signal CK2.

Looking now to the correction circuit 40, in includes correction circuits 41-46 that correct digital signals Do1-Do6 generated in conversion stages 20-1 to 20-6. The most-significant bit in 4-bit digital signal Do1 outputs from delay circuit 37 inputs as a carry signal is input to the correction circuit 46. The correction circuit 46 corrects digital signal Do6 based on the input carry signal, and as the correction result, it generates a 3-bit digital signal. In the correction, for example, the input carry signal and digital signal Do6 of the connection object are added to generate a 3-bit digital signal. The correction circuit 46 outputs the most-significant bits in the generated 3-bit digital signal as the carry signal to correction circuit 45, and, at the same time, it outputs the least-significant two bits as the place-4 and place-5 bit signals B3, B4 of digital signal DOUT to register 50. Correction circuits 41-45 generate digital signals Do1-Do5 as the correction object and the carry signal in company with correction of the digital signal generated in the conversion stage downstream of the conversion stage of the generating origin of the digital signal input to it. For example, for correction circuit 45, its generating origin of digital signal Do5 as the correction object is conversion stage 20-5, and its downstream stage is conversion stage 20-6. Digital signal Do6 generated in conversion stage 20-6 is corrected by correction circuit 46, and correction circuit 45 receives the carry signal from correction circuit 46. Here, correction circuits 41-45 correct the digital signals as the correction object based on the input carry signal, and they generate the 3-bit digital signals as the correction results. In this correction, for example, the carry signal input from the downstream conversion stage and the digital signals Do1-Do5 as the correction object are added to generate the 3-bit digital signal.

Additionally, correction circuits 41-45 output the carry signal generated corresponding to the correction result for correcting the digital signal generated by the upstream conversion stage with respect to the conversion stage of the generating origin of digital signals Do1-Do5 as the correction object. For example, for correction circuit 45, the upstream stage with respect to conversion stage (20-5) as the generating origin of digital signal Do5 is conversion stage (20-4). Digital signal Do4 generated by conversion stage (20-4) is corrected by correction circuit 44, so that correction circuit 45 outputs the carry signal to correction circuit 44. In this case, correction circuits 41-45 output the most-significant bit among the generated 3-bit digital signal as the carry signal to the upstream conversion stage, while they output the remaining two bits as a portion of digital signal Dout to register 50. For example, correction circuit 45 outputs the most-significant bit of the generated 3-bit digital signal as the carry signal to correction circuit 44, and it outputs the remaining two bits as bit signals B5, B6 (the 6th and 7th places) of digital signal Dout to register 50. In addition, the top correction circuit 41 outputs the carry signal generated in company with correction of digital signal Do1 as bit signal B15 (16th place) of digital signal Dout to register 50. While register 50 outputs the least-significant 3 bits of 4-bit digital signal Do1 from delay circuit 37 input as bit signals B0-B2 (1st place to 3rd place) of digital signal Dout, the 13-bit signal output from correction circuit 40 is input as bit signals B3-B15 (4th place to 16th place) of digital signal Dout. The register 50 holds input bit signals B0-B15 in synchronization with clock signal CK1 or CK2.

As explained above, in power conservation mode, conversion stage 20-1 is turned off, and the input signal to conversion stage 20-1 is input to conversion stage 20-2 as the downstream stage. As a result, it is possible to efficiently decrease power consumption by performing analog/digital conversion while the number of conversion stages is smaller than that in normal mode.

Also, in power conservation mode, the top conversion stage is turned off. For the upstream conversion stage, signals should be processed at a higher precision than in the downstream conversion stage. Consequently, the upstream conversion stage consumes a larger current than the downstream conversion stage. Consequently, it is possible to efficiently decrease the power consumption by turning off the top conversion stage 20-1 that consumes the largest current. Also, for the ADC in the present embodiment, the frequency of the clock signals CK1, CK2 in power conservation mode is much lower than that of the normal mode.

When the frequency of the clock signal decreases, the operational speed required on the conversion stage is lower, and it is possible to meet the necessary precision corresponding to a smaller current consumption. That is, in normal mode at a high operation frequency, the least-significant conversion stage that cannot meet the precision needed for the most-significant stage can meet the precision of the most-significant stage in power conservation mode at a lower operation frequency.

Consequently, for ADC 100-1, the upstream conversion stage in normal mode is turned off in power conservation mode, and the downstream conversion stage is shifted for use as the upstream conversion stage. Even in this case, the current consumption of the downstream conversion stage is kept the same as that in normal mode, and the necessary precision can be met. As a result, there is no need to change and adjust the current consumption of the downstream conversion stage corresponding to the operation mode. Consequently, it is possible to simplify the circuit. Also, there is no need to have an excessive current for consumption flow in the downstream conversion stage, so that there is no degradation in the effect of decrease in the current consumption. Also, the circuit may also have a constitution in which supply of clock signals CK1 and CK2 to conversion stage 20-1 is turned off in the off state and delay circuit 31 of digital signal Do1. As a result, it is possible to further decrease power consumption. Also, when conversion stage 20-1 is turned off due to transition to power conservation mode, by means of clock switch 70, the timing of sampling of the input signal and the timing of holding of the sampled results in conversion stages 20-2 to 20-6 downstream from conversion stage 20-1, which has been turned off, are inverted.

Consequently, with the ADC 100-1, even when the number of conversion stages is changed due to transition to power conservation mode, it is still possible to set the sampling/holding timing in each conversion stage appropriately. Also, corresponding to inversion of the timing of conversion stage 20, the timing of latching in delay circuit 30 is inverted by clock switch 70. As a result, by changing the timing of sampling and holding to change the timing of output of the digital signal from each conversion stage, delay circuit 30 still can latch the digital signal at an appropriate timing. Additionally, when the second conversion stage 20-2 becomes substantially the first stage in power conservation mode, the carry signal generated by correction circuit 42, which carries out correction of digital signal Do2, is output as the most-significant bit (B13) of the analog/digital conversion result Dout from correction circuit 41 to register 50.

Figure 4:
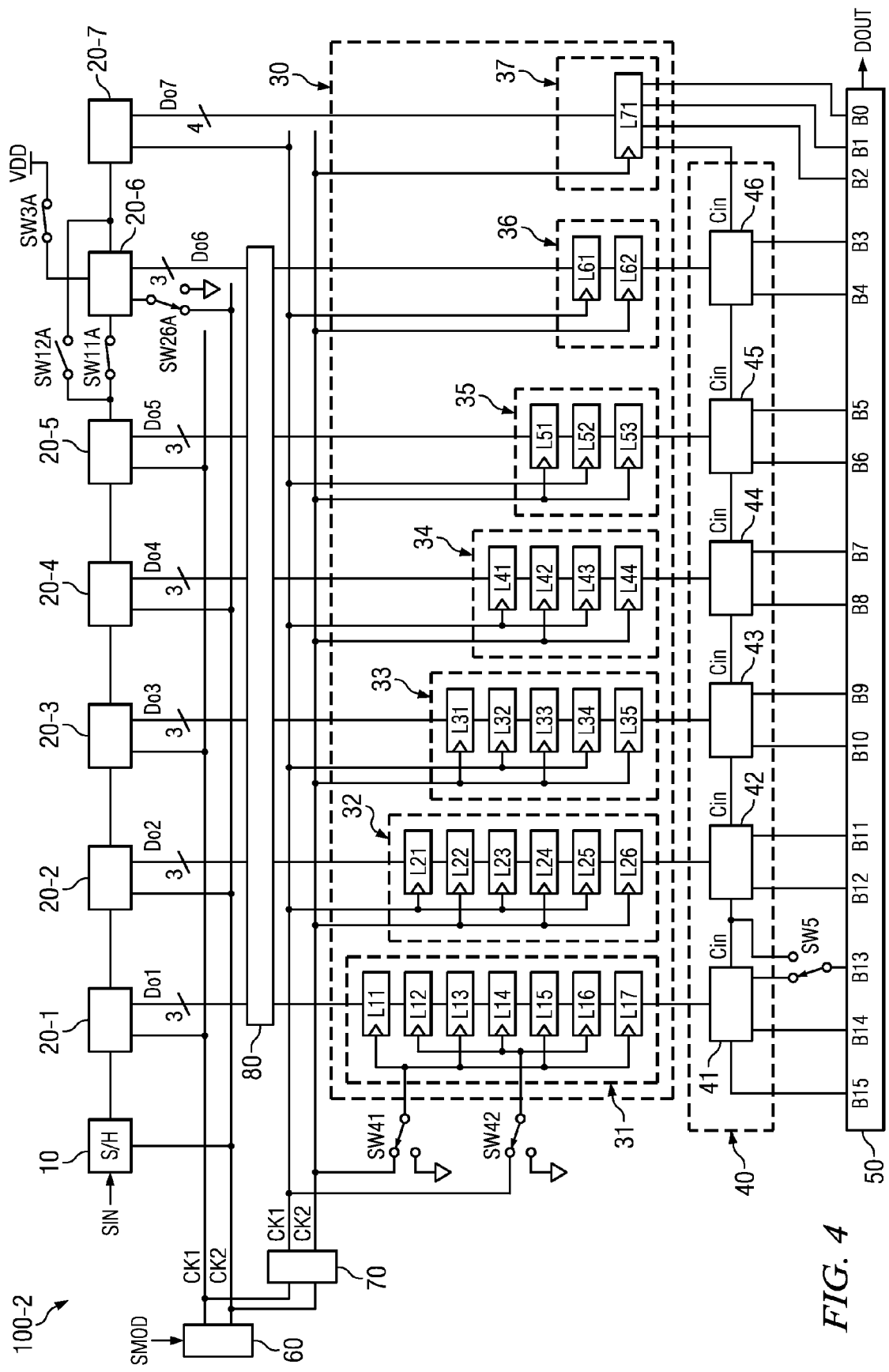
FIGS. 4 and 5 are block diagrams of examples of ADCs in accordance with a preferred embodiment of the present invention.

Turning now to FIG. 4, ADC 100-2 can be seen. ADC 100-2 is similar in structure to ADC 100-1. However, switches SW11, SW12, SW3, and SW4 have been replaced by switches SW11A, SW12A, SW3A, SW41, SW42, SW26A and SW5, and crossbar 80 has been included. As with ADC 100-1, ADC 100-2 operates in two modes: power conservation mode and normal mode.

In power conservation mode, switches SW11A, SW12A, SW3A, SW5, and SW26A are controlled to skip or bypass stage 20-6. Switch SW3A cuts off the power supply to conversion stage 20-6, while switch SW26A turns off supply of the clock signal with respect to conversion stage 20-6. Additionally, switch SW11A and switch SW12A controls the output signal of conversion stage 20-5 to bypass conversion stage 20-6 and be input to conversion stage 20-7. Switch SW11A is provided in the path that connects the output of conversion stage 20-5 and the input of conversion stage 20-6. Switch SW12A is provided in the path that connects the output of conversion stage 20-5 and the input of conversion stage 20-7. Also, switch SW5 decouples correction circuit 41 from input B13 in power conservation mode.

In contrast, switches SW11A, SW12A, SW13A, SW41, SW42, SW26A and SW5 are controlled to include stage 20-6 in normal mode. In particular, switch SW12A is open, and switches SW3A and SW11A are closed. Additionally, switch SW26A couples stage 20-6 to receive the clock signal.

Look to crossbar 80, it switches couplings between upstream conversion stages 20-1 to 20-5 and delay circuits 31-36 so that the timing of output of digital signal Do7 of conversion stage 20-7 downstream from conversion stage 20-6 in the off state from delay circuit 30 and the timing of output of digital signals Do1-Do5 of upstream conversion stages 20-1 to 20-5 from conversion stage 20-6 in the off state from delay circuit 30 are in agreement with each other. That is, in normal mode, crossbar 80 couples conversion stages 20-1 to 20-6 to delay circuits 31-36, respectively, and in power conservation mode, crossbar 80 coupled conversion stages 20-1 to 20-5 to delay circuits 32-36, respectively. In power conservation mode, conversion stages 20-1 to 20-5 are shifted downstream by one stage, and the delay of digital signals Do1-Do5 is shortened by a half-period of the clock signal.

Corresponding to switching of conversion stages (20-1 to 20-5) and delay circuits 31-36 by crossbar 80, clock switch 70 switches clock signals CK1 and CK2 input to the various latch circuits of the delay circuit so that the digital signals output from the various conversion stages are held in the latch circuits of the delay circuit at an appropriate timing. In normal mode, clock signal CK1 is fed to the odd number latch circuits of delay circuits 32, 34, and 36 and the even number latch circuits of delay circuits 31, 33, and 35, and clock signal CK2 is fed to the even number latch circuits of delay circuits 32, 34, 36 and the odd number latch circuits of delay circuits 31, 33, 35. On the other hand, in power conservation mode, the supply destinations of clock signals CK1 and CK2 are reversed, and, at the same time, by means of switch SW41 and switch SW42, feed of clock signals CK1, CK2 to delay circuit 31 is turned off. Also, clock switch 70 feeds clock signal CK1 to conversion stage 20-7 in normal mode and feeds clock signal CK2 to conversion stage 20-7 in power conservation mode.

Figure 5:
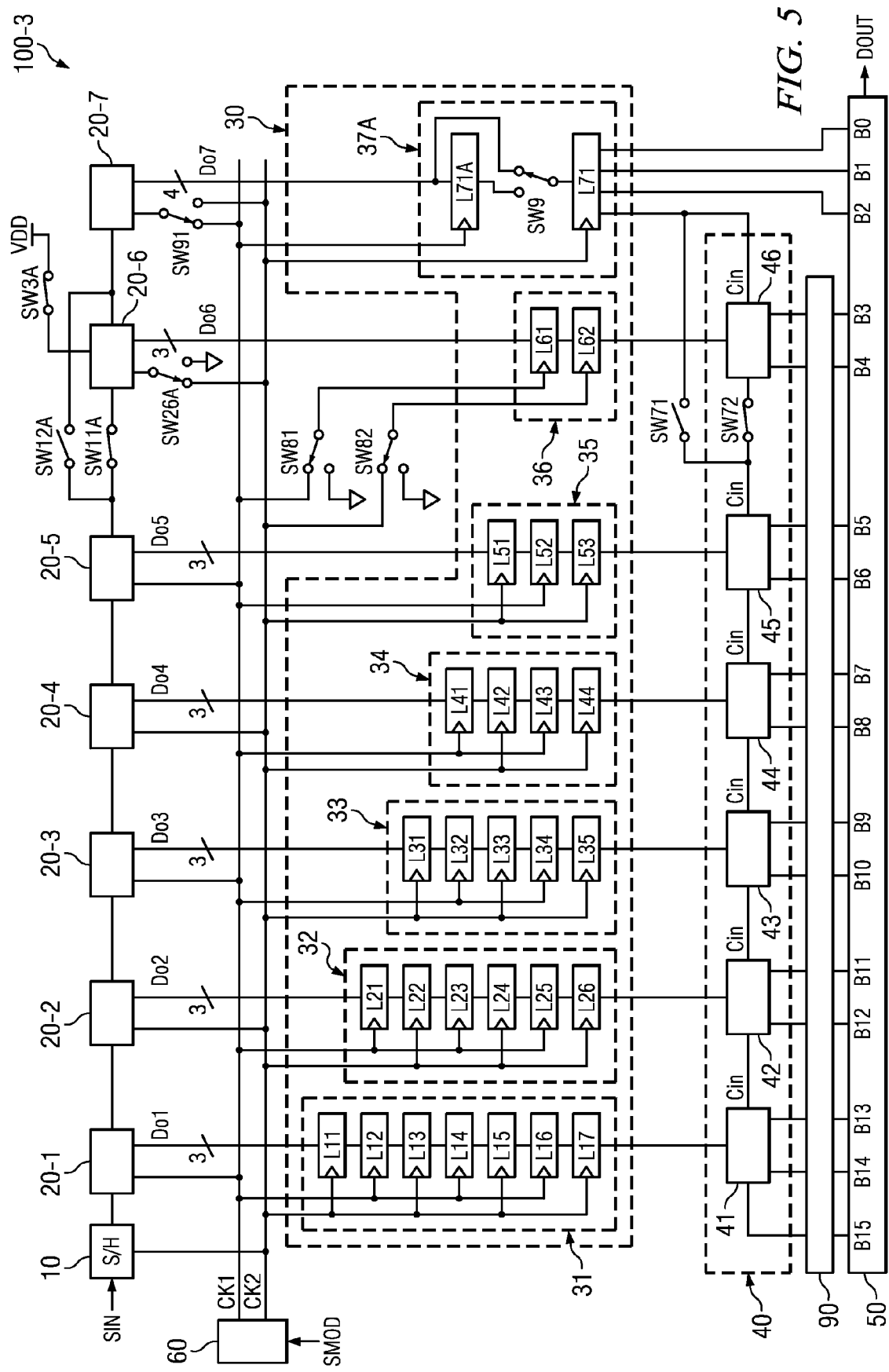

Turning now to FIG. 5, ADC 100-3 can be seen. ADC 100-3 is similar in construction to ADC 100-2, but switches SW41 and SW42, clock switch 70, and crossbar 80 have been omitted. Additionally, switches SW71, SW72, SW81, SW82, SW91 and crossbar 90 are provided, and delay circuit 37 is has been by delay circuit 37A. Similar to both ADCs 100-1 and 100-2, ADC 100-3 has two modes of operation: power conservation mode and normal mode. As a results, switches SW12A, SW11A, SW3, and SW26A of ADC 100-3 have the same configurations as with ADC 100-2.

When conversion stage 20-6 is in off state in power conservation mode, delay circuit 37A increases the number of stages of the latch circuits in delay circuit (37A) by one stage so that digital signals Do1-Do5 generated sequentially in conversion stages 20-1 to 20-5 upstream of conversion stage 20-6 and digital signal Do7 generated after digital signal Do6 in conversion stage 20-7 downstream of conversion stage 20-6 are output at the common timing from delay circuit 30. For example, as shown in FIG. 7, delay circuit 37A has latch circuit L71, latch circuit L71A, and switch SW9. The latch circuit L71A latches digital signal Do7 in synchronization with the rising edge of clock signal CK1. The switch SW9 selects digital signal Do7 (output signal of conversion stage (20-7)) in normal mode, and it selects the output signal of latch circuit L71A in power conservation mode. The latch circuit L71 latches the signal selected by switch SW9 in synchronization with the rising edge of clock signal CK2. The switch SW81 and switch SW82 turn off supply of clock signals CK1 and CK2 to latch circuits L61 and L62 of delay circuit 36 in power conservation mode. Switch SW81 inputs clock signal CK1 to latch circuit L61 in normal mode, and it inputs a low-level signal instead of clock signal CK1 in power conservation mode. The switch SW82 inputs clock signal CK2 to latch circuit L62 in normal mode, and it inputs a low-level signal instead of clock signal CK2 in power conservation mode.

Switches SW71 and SW72 also operate to varying coupling depending on the mode of operation. In power conservation mode, correction circuit 46 stops generating digital signal Do6, and the carry signal from the least-significant place is input to correction circuit 45. That is, switches SW71 and SW72 select the carry signal from correction circuit 46 or the most-significant bit of latch circuit L71 and input it as the carry signal to correction circuit 45. Switch SW71 is provided in the path that connects the input of the carry signal of correction circuit 46 and the input of the carry signal of correction circuit 45, and it is turned off in normal mode and turned on in power conservation mode. Switch SW72 is provided in the path between output of the carry signal of correction circuit 46 and input of the carry signal of correction circuit 45, and it is turned on in normal mode and off in power conservation mode.

Crossbar 90 also operates to varying coupling depending on the mode of operation. Crossbar 90 switches couplings between the output of correction circuit 40 and the input of register 50 corresponding to the operation mode. That is, crossbar 80 inputs the 13-bit output signal of correction circuit 40 as bit signals B3-B15 to register 50 in normal mode, and it inputs the most-significant 11-bit output signal of correction circuit 40 as bit signals B3-B13 to register 50. In this case, crossbar 90 outputs a low level (value 0) signal to bit signals B15 and B14 of register 50.

Having thus described the invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the invention may be employed without a corresponding use of the other features. Accordingly, it is appropriate that the appended claims be construed broadly and in a manner consistent with the scope of the invention.

The invention claimed is:

1. An apparatus comprising:
   a clock generator that generates a plurality of clock signals;
   a sample-and-hold (S/H) circuit that is coupled to the clock generator and that receives an input signal;
   a plurality conversion stages coupled in series with one another in a sequence, wherein each conversion stage is coupled to the clock generator;
   a switch network that is coupled to at least one of the conversion stage so as to turn it off and bypass it in a power conservation mode;
   a plurality of delay circuits, wherein each delay circuit is coupled to at least one of the conversion stages, and wherein each delay circuit includes at least one latch that is coupled to the clock generator;
   a plurality of correction circuit, wherein each correction circuit is coupled to at least one of the delay circuits; and
   a register that is coupled to each of the correction circuits.

2. The apparatus of claim 1, wherein the apparatus further comprises a clock switch that is coupled between the clock generator and each of the delay circuits.

3. The apparatus of claim 2, wherein the clock switch that is coupled between the clock generator and each of the conversion stages.

4. The apparatus of claim 3, wherein the switch network further comprises:
   a first switch that is coupled between the S/H circuit and the first conversion stage of the sequence, wherein the first switch is closed in a normal mode, and wherein the first switch is open in the power conservation mode;
   a second switch that is coupled between the S/H circuit and the second conversion stage of the sequence, wherein the second switch is open in the normal mode, and wherein the second switch is closed in the power conservation mode;
   a third switch that is coupled between a power supply and the first conversion stage of the sequence, wherein the third switch is closed in the normal mode, and wherein the third switch is open in the power conservation mode; and
   a fourth switch that is coupled between the first conversion stage of the sequence and its delay circuit, wherein fourth switch couples the first conversion stage of the sequence to it delay circuit in the normal mode.

5. The apparatus of claim 2, wherein the apparatus further comprises a crossbar that is coupled between at least one of the conversion stages and its delay circuit.

6. The apparatus of claim 5, wherein the switch network further comprises:
   a first switch that is coupled between the third-to-last conversion stage of the sequence and the second-to-last conversion stage of the sequence, wherein the first switch is closed in a normal mode, and wherein the first switch is open in the power conservation mode;
   a second switch that is coupled between the third-to-last conversion stage of the sequence and the last conversion stage of the sequence, wherein the second switch is open in the normal mode, and wherein the second switch is closed in the power conservation mode;
   a third switch that is coupled between a power supply and the second-to-last conversion stage of the sequence, wherein the third switch is closed in the normal mode, and wherein the third switch is open in the power conservation mode; and
   a fourth switch that is coupled between the second-to-last conversion stage of the sequence and the clock generator, wherein fourth switch couples the first conversion stage of the sequence to it delay circuit in the normal mode.

7. The apparatus of claim 6, wherein the switch network further comprises a first switch network, and wherein the apparatus further comprises a second switch network that is coupled between the clock switch and the delay circuit associated with the first conversion stage of the sequence.

8. The apparatus of claim 1, wherein the switch network further comprises:
- a first switch that is coupled between the third-to-last conversion stage of the sequence and the second-to-last conversion stage of the sequence, wherein the first switch is closed in a normal mode, and wherein the first switch is open in the power conservation mode;
- a second switch that is coupled between the third-to-last conversion stage of the sequence and the last conversion stage of the sequence, wherein the second switch is open in the normal mode, and wherein the second switch is closed in the power conservation mode;
- a third switch that is coupled between a power supply and the second-to-last conversion stage of the sequence, wherein the third switch is closed in the normal mode, and wherein the third switch is open in the power conservation mode; and
- a fourth switch that is coupled between the second-to-last conversion stage of the sequence and the clock generator, wherein fourth switch couples the first conversion stage of the sequence to it delay circuit in the normal mode.

9. The apparatus of claim 8, wherein the switch network further comprises a first switch network, and wherein the apparatus further comprises a second switch network that is coupled between the clock generator and the delay circuit associated with the second-to-last conversion stage of the sequence.

10. The apparatus of claim 9, wherein the apparatus further comprises a crossbar that is couple between each of the correction circuits and the register.

11. An apparatus comprising:
- a clock generator that generates a plurality of clock signals;
- a sample-and-hold (S/H) circuit that is coupled to the clock generator and that receives an input signal;
- a plurality conversion stages coupled in series with one another in a sequence, wherein each conversion stage is coupled to the clock generator, and wherein each conversion stage includes:
  - an analog-to-digital converter (ADC);
  - a digital-to-analog converter (DAC) that is coupled to the DAC;
  - a S/H circuit;
  - an adder that is coupled to the S/H circuit and the DAC so as to generate a difference between output of the S/H circuit and the DAC; and
  - an amplifier that is coupled to the adder;
- a switch network that is coupled to at least one of the conversion stage so as to turn it off and bypass it in a power conservation mode;
- a plurality of delay circuits, wherein each delay circuit is coupled to at least one of the conversion stages, and wherein each delay circuit includes at least one latch that is coupled to the clock generator;
- a plurality of correction circuit, wherein each correction circuit is coupled to at least one of the delay circuits; and
- a register that is coupled to each of the correction circuits.

12. The apparatus of claim 11, wherein the apparatus further comprises a clock switch that is coupled between the clock generator and each of the delay circuits.

13. The apparatus of claim 12, wherein the clock switch that is coupled between the clock generator and each of the conversion stages.

14. The apparatus of claim 13, wherein the switch network further comprises:
- a first switch that is coupled between the S/H circuit and the first conversion stage of the sequence, wherein the first switch is closed in a normal mode, and wherein the first switch is open in the power conservation mode;
- a second switch that is coupled between the S/H circuit and the second conversion stage of the sequence, wherein the second switch is open in the normal mode, and wherein the second switch is closed in the power conservation mode;
- a third switch that is coupled between a power supply and the first conversion stage of the sequence, wherein the third switch is closed in the normal mode, and wherein the third switch is open in the power conservation mode; and
- a fourth switch that is coupled between the first conversion stage of the sequence and its delay circuit, wherein fourth switch couples the first conversion stage of the sequence to it delay circuit in the normal mode.

15. The apparatus of claim 12, wherein the apparatus further comprises a crossbar that is coupled between at least one of the conversion stages and its delay circuit.

16. The apparatus of claim 15, wherein the switch network further comprises:
- a first switch that is coupled between the third-to-last conversion stage of the sequence and the second-to-last conversion stage of the sequence, wherein the first switch is closed in a normal mode, and wherein the first switch is open in the power conservation mode;
- a second switch that is coupled between the third-to-last conversion stage of the sequence and the last conversion stage of the sequence, wherein the second switch is open in the normal mode, and wherein the second switch is closed in the power conservation mode;
- a third switch that is coupled between a power supply and the second-to-last conversion stage of the sequence, wherein the third switch is closed in the normal mode, and wherein the third switch is open in the power conservation mode; and
- a fourth switch that is coupled between the second-to-last conversion stage of the sequence and the clock generator, wherein fourth switch couples the first conversion stage of the sequence to it delay circuit in the normal mode.

17. The apparatus of claim 16, wherein the switch network further comprises a first switch network, and wherein the apparatus further comprises a second switch network that is coupled between the clock switch and the delay circuit associated with the first conversion stage of the sequence.

18. The apparatus of claim 11, wherein the switch network further comprises:
- a first switch that is coupled between the third-to-last conversion stage of the sequence and the second-to-last conversion stage of the sequence, wherein the first switch is closed in a normal mode, and wherein the first switch is open in the power conservation mode;
- a second switch that is coupled between the third-to-last conversion stage of the sequence and the last conversion stage of the sequence, wherein the second switch is open in the normal mode, and wherein the second switch is closed in the power conservation mode;
- a third switch that is coupled between a power supply and the second-to-last conversion stage of the sequence, wherein the third switch is closed in the normal mode, and wherein the third switch is open in the power conservation mode; and a fourth switch that is coupled between the second-to-last conversion stage of the sequence and the clock generator, wherein fourth switch couples the first conversion stage of the sequence to it delay circuit in the normal mode.

19. The apparatus of claim 18, wherein the switch network further comprises a first switch network, and wherein the apparatus further comprises a second switch network that is coupled between the clock generator and the delay circuit associated with the second-to-last conversion stage of the sequence.

20. The apparatus of claim 19, wherein the apparatus further comprises a crossbar that is couple between each of the correction circuits and the register.

* * * * *